United States Patent
Haynie et al.

(10) Patent No.: US 12,557,332 B2
(45) Date of Patent: Feb. 17, 2026

(54) THREE-DIMENSIONAL TRANSISTOR DEVICE HAVING CONFORMAL LAYER

(71) Applicant: TEXAS INSTRUMENTS INCORPORATED, Dallas, TX (US)

(72) Inventors: Sheldon Douglas Haynie, Myrtle Beach, SC (US); Scott Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/732,211

(22) Filed: Apr. 28, 2022

(65) Prior Publication Data
US 2023/0352580 A1 Nov. 2, 2023

(51) Int. Cl.
*H10D 30/65* (2025.01)
*H10D 30/01* (2025.01)
*H10D 62/10* (2025.01)
*H10D 64/01* (2025.01)
*H10D 64/23* (2025.01)

(52) U.S. Cl.
CPC ....... *H10D 30/655* (2025.01); *H10D 30/0285* (2025.01); *H10D 64/257* (2025.01); *H10D 64/258* (2025.01); *H10D 62/102* (2025.01); *H10D 64/01* (2025.01)

(58) Field of Classification Search
CPC .......... H01L 29/66681; H01L 29/7816; H01L 29/7823; H01L 29/7824; H01L 29/7825; H01L 29/7826; H01L 29/66689; H01L 29/66696; H01L 29/66704; H01L 29/42368
See application file for complete search history.

(56) References Cited

U.S. PATENT DOCUMENTS

| | | | |
|---|---|---|---|
| 4,732,841 A | 3/1988 | Radigan | |
| 5,640,034 A | 6/1997 | Malhi | |
| 8,253,193 B2 | 8/2012 | Denison et al. | |
| 8,575,015 B2 | 11/2013 | Denison | |
| 10,978,559 B1 * | 4/2021 | Haynie | ............ H01L 29/42368 |
| 2009/0273026 A1 | 11/2009 | Wilson et al. | |
| 2012/0098062 A1 | 4/2012 | Pendharkar et al. | |
| 2012/0104493 A1 | 5/2012 | Denison et al. | |

* cited by examiner

*Primary Examiner* — Raj R Gupta
(74) *Attorney, Agent, or Firm* — Zhenhai Fu; Frank D. Cimino

(57) ABSTRACT

A semiconductor device includes a semiconductor substrate including a corrugated surface. A body has a first conductivity type and includes a portion extending continuously along the corrugated surface. A gate dielectric layer is on the body and extends continuously along the corrugated surface. A gate is on the gate dielectric layer, the gate extending continuously along the corrugated surface. A corrugated conformal drift region has a second conductivity type opposite from the first conductivity type, and is on and conformal with the corrugated surface of the semiconductor substrate, and extends continuously along the corrugated surface. A source has the second conductivity type and includes a portion extending continuously along the corrugated surface, the source being in contact with the body. A drain contact region electrically coupled to the drift region and having the second conductivity type.

17 Claims, 14 Drawing Sheets

THREE-DIMENSIONAL TRANSISTOR DEVICE HAVING CONFORMAL LAYER

BACKGROUND

Semiconductor devices often have one or more metal oxide semiconductor (MOS) transistors with extended drains, commonly referred to as extended drain MOS transistors. An extended drain MOS transistor may be operated with a higher potential on the drain than on the gate, and may be used in a power circuit. Parasitic effects in power devices can limit the power handling of power devices. There are further demands for improvements in suppression of parasitic effects.

SUMMARY

In one aspect of this description, a semiconductor device includes a semiconductor substrate including a corrugated surface. A body has a first conductivity type and includes a portion extending continuously along the corrugated surface. A gate dielectric layer is on the body and extends continuously along the corrugated surface. A gate is on the gate dielectric layer, the gate extending continuously along the corrugated surface. A corrugated conformal drift region has a second conductivity type opposite from the first conductivity type, and is on and conformal with the corrugated surface of the semiconductor substrate, and extends continuously along the corrugated surface. A source has the second conductivity type and includes a portion extending continuously along the corrugated surface, the source being in contact with the body. A drain contact region electrically coupled to the drift region and having the second conductivity type.

In another aspect of this description, a folded laterally-diffused metal-oxide semiconductor (LDMOS) device includes a silicon substrate having a first conductivity type and including a trench, a fin, and, a corrugated surface on the trench and the fin. A body has the first conductivity type and includes a portion extending continuously along the corrugated surface. A gate dielectric layer is on the body extending continuously along the corrugated surface. A gate is on the gate dielectric layer. The gate extends continuously along the corrugated surface. A corrugated epitaxial drift region has a second conductivity type opposite from the first conductivity type, and is on and conformal with the corrugated surface of the silicon substrate, and extends continuously along the corrugated surface. A source has the second conductivity type and includes a portion extending continuously along the corrugated surface. A drain contact region is electrically coupled to the drift region and having the second conductivity type.

A method of forming a semiconductor device includes forming a corrugated surface on a semiconductor substrate having a first conductivity type by etching. A doped conformal film is deposited on the corrugated surface of the semiconductor substrate. The doped conformal film has a second conductivity type opposite from the first conductivity type, and is conformal with the corrugated surface of the semiconductor substrate, and extends continuously along the corrugated surface. The conformal film includes a first region and a drift region. A body having a first conductivity type is formed by conformal doping. The body has the first conductivity type. A gate dielectric layer is formed on the body. The gate dielectric layer extends continuously along the corrugated surface. A gate is formed on the gate dielectric layer. The gate extends continuously along the corrugated surface. A source of the second conductivity type in contact with the body is formed. The source includes a portion extending continuously along the corrugated surface. A drain contact region electrically coupled to the drift region and having the second conductivity type is formed.

DETAILED DESCRIPTION

An extended-drain MOS transistor may be operated with a higher electrical potential on the drain than on the gate, and may be used in a power circuit. A three-dimensional (3D) extended drain MOS transistor (e.g., folded extended-drain MOS transistor) has reduced specific-on-resistance as compared to planar extended drain MOS transistor. A folded extended-drain having relatively sharp junctions can lead to improved characteristics in, such as improvements in suppression of parasitic effects, reduced specific on-resistance area product (Rds*Area), or Rsp, improved safe operating area and electro-static discharge robustness, and reduced capacitance per area. However, it is difficult to make a sharp junction (such as a sharp junction of a drift region on a charge balance region) in a 3D extended-drain MOS transistor using ion implantation, e.g., due to interference of fins of the 3D transistor with implantation beam and concentration uniformity or variation of ion implantation.

This description is directed to a 3D power transistor device with a sharp junction of an epitaxial conformal drift layer (or drift region) on an underlying layer and a method of forming the 3D power transistor device. Such a transistor device may be beneficially employed as a high-voltage transistor device with improved suppression of parasitic effects.

The described examples include a semiconductor device that has a semiconductor substrate having a corrugated surface. A body of the device has a first conductivity type and includes a portion extending continuously along the corrugated surface. A corrugated conformal drift region has a second conductivity type opposite from the first conductivity type, and is on and conformal with the corrugated surface of the semiconductor substrate. Further, the drift region extends continuously along the corrugated surface. The corrugated surface can be deposited by a conformal film formation technique, such as epitaxy chemical vapor deposition (CVD). The corrugated conformal drift region advantageously allows a sharp transition in net doping concentrations from the corrugated conformal drift region to a charge balance region.

Figure 2:
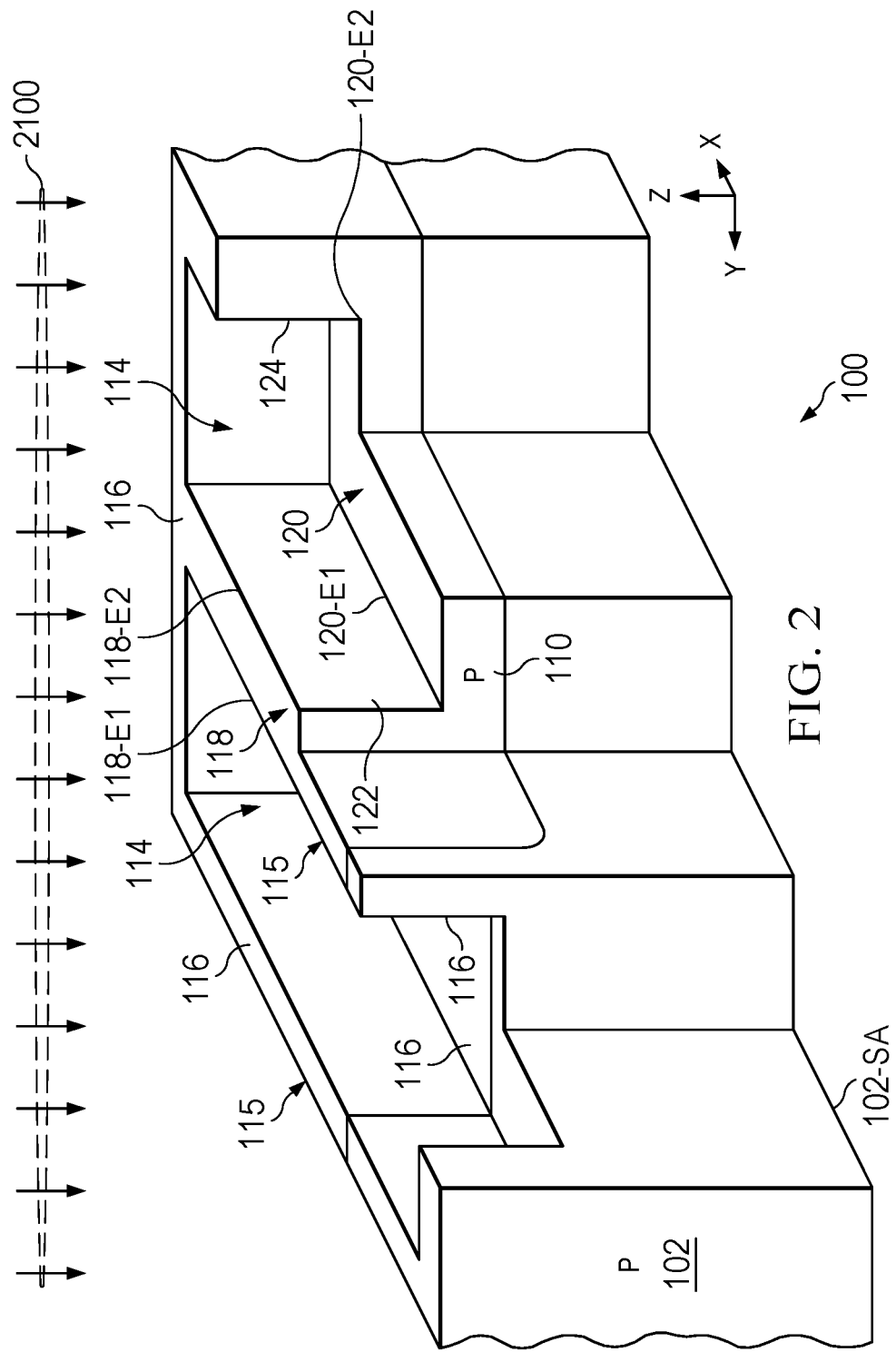
FIG. 2 is a further three-dimensional, cut-away view of the semiconductor structure in which trenches are formed in the substrate and in the charge balance region, according to the described examples.
Figure 3:
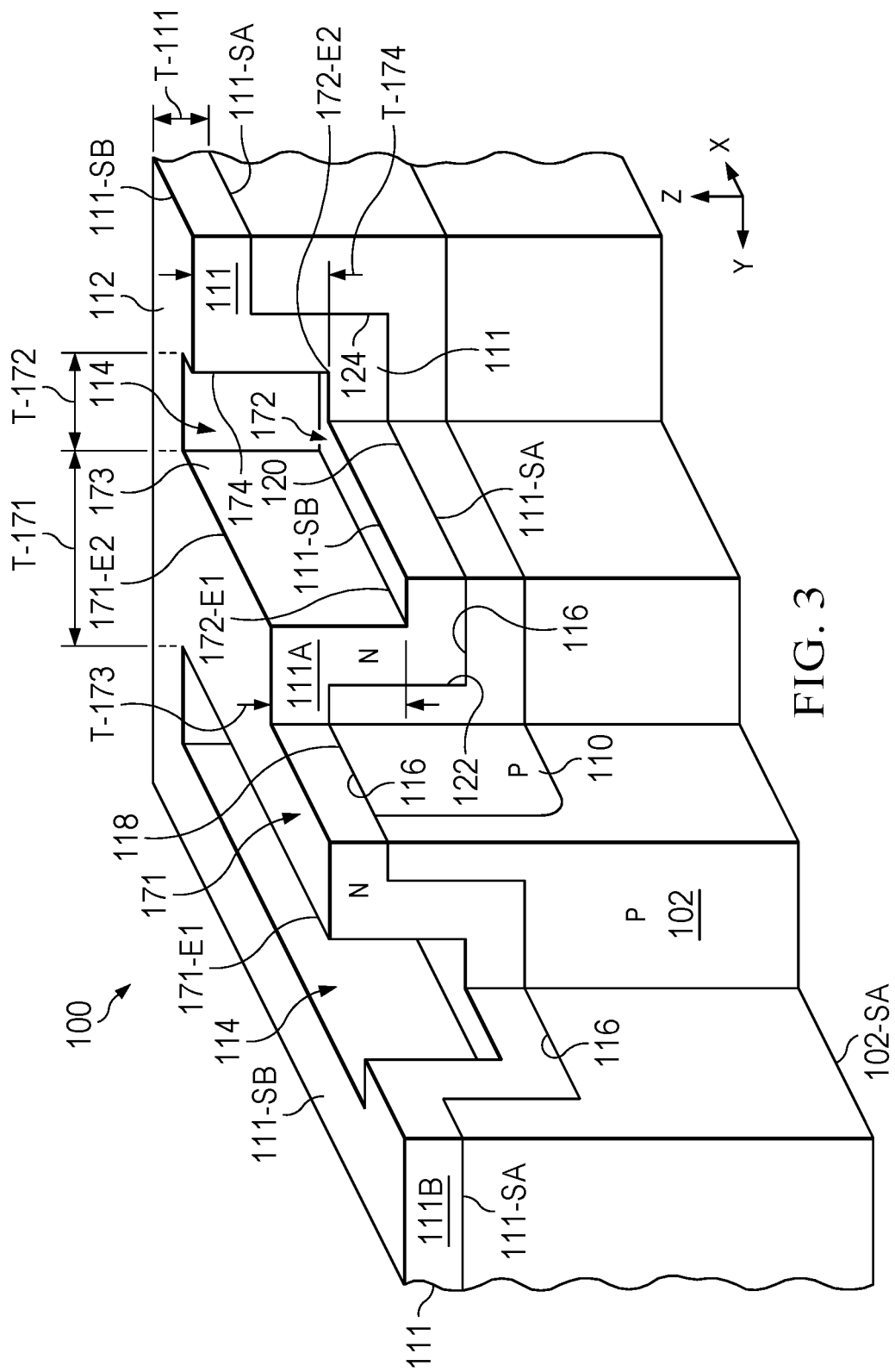
FIG. 3 is a further three-dimensional, cut-away view of the semiconductor structure in which a doped conformal film is formed on a corrugated surface, according to the described examples.
Figure 4:
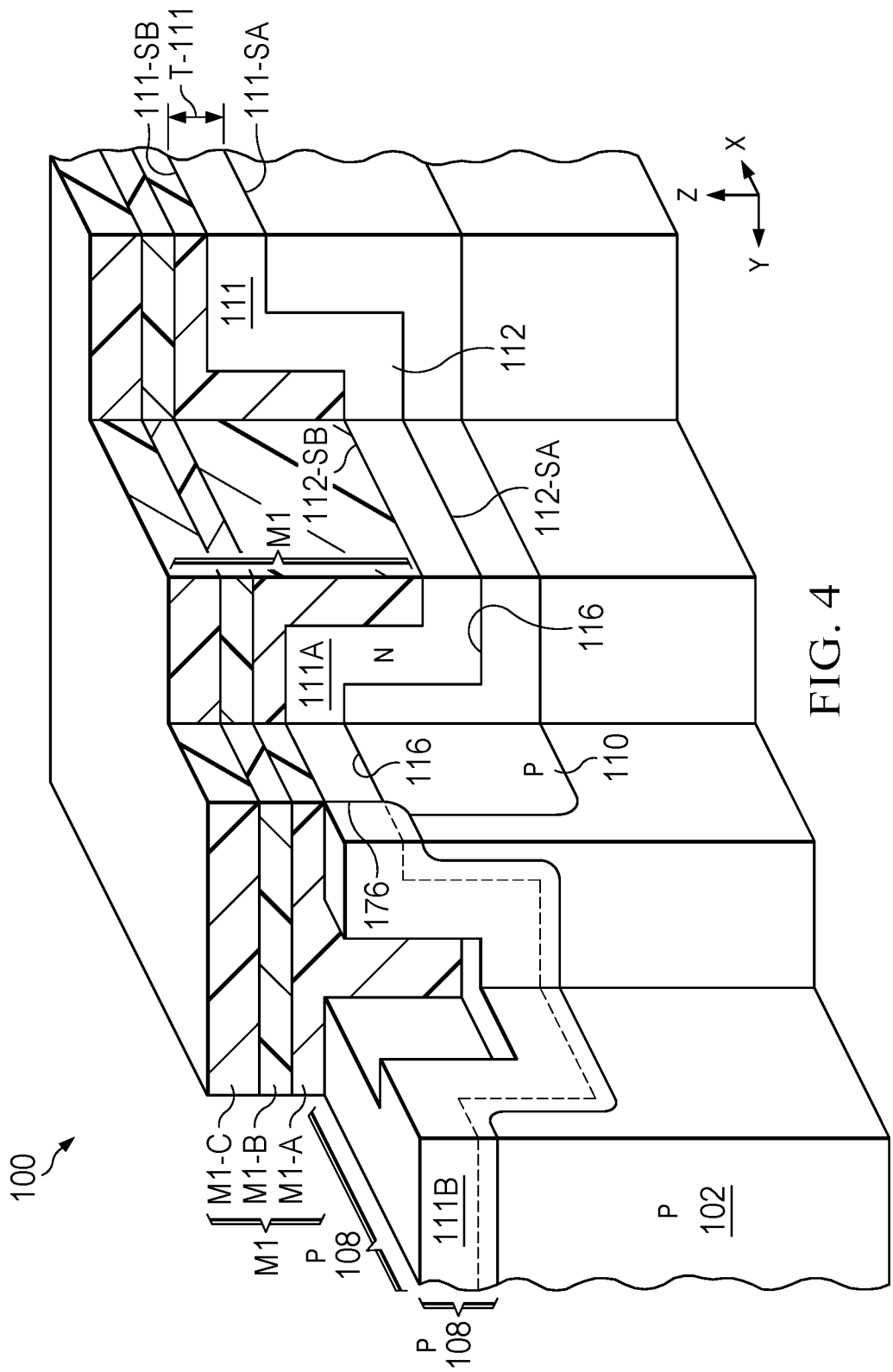
FIG. 4 is a further three-dimensional, cut-away view of the semiconductor structure in which the body is formed by doping, according to the described examples.
Figure 11:
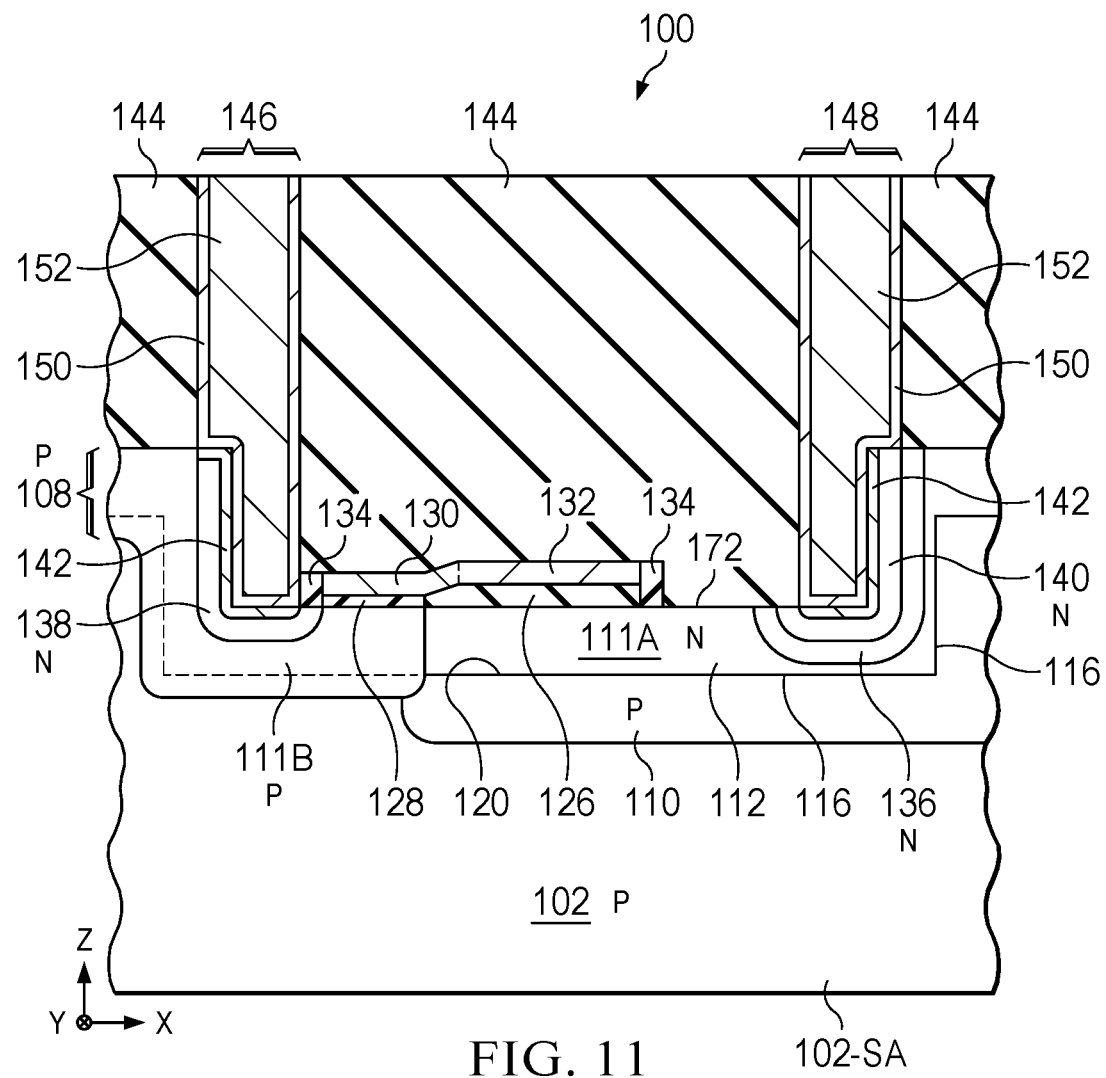
FIG. 11 is a cross-sectional view of the semiconductor device of FIG. 10, according to the described examples.
Figure 12:
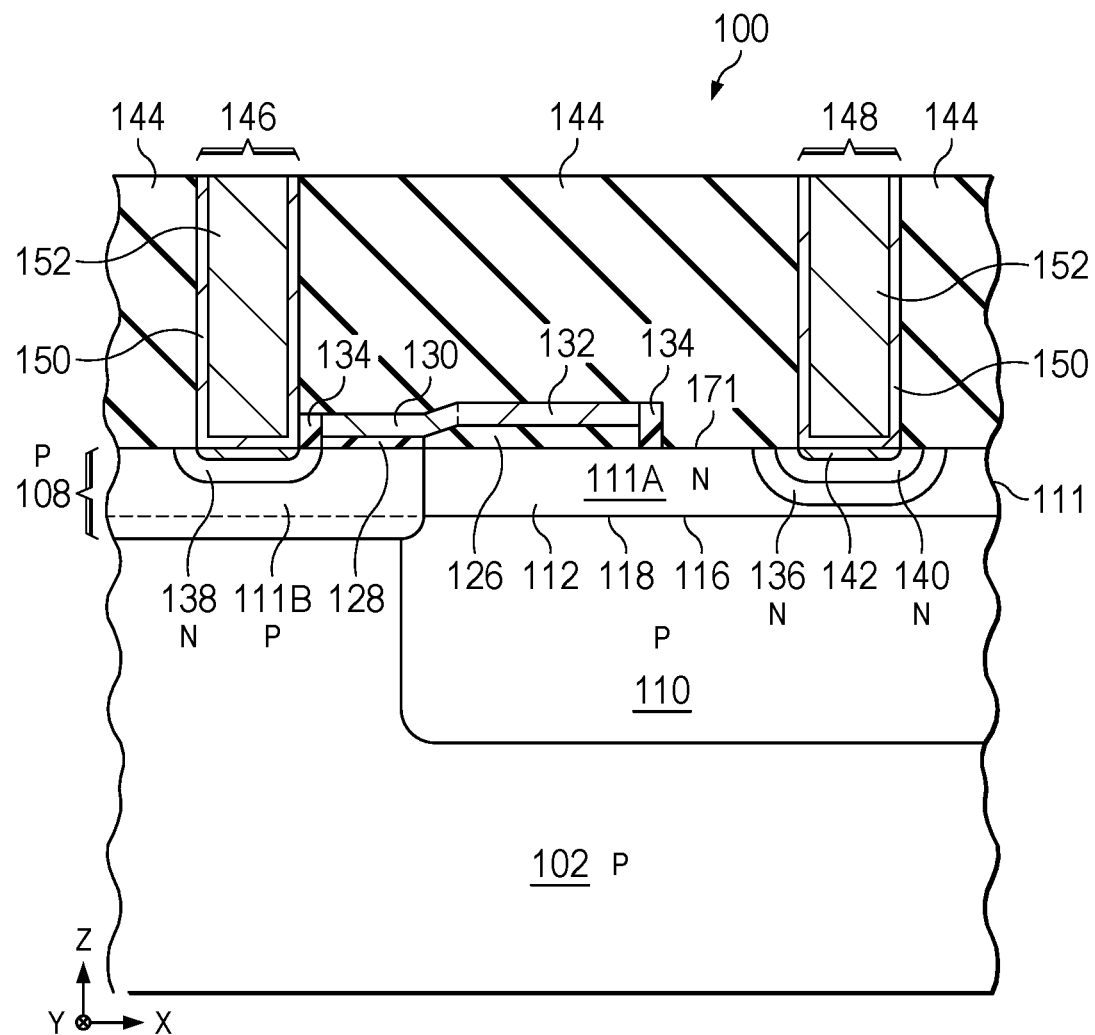
FIG. 12 is a further cross-sectional view of the semiconductor device of FIG. 10, according to the described examples.
Figure 13:
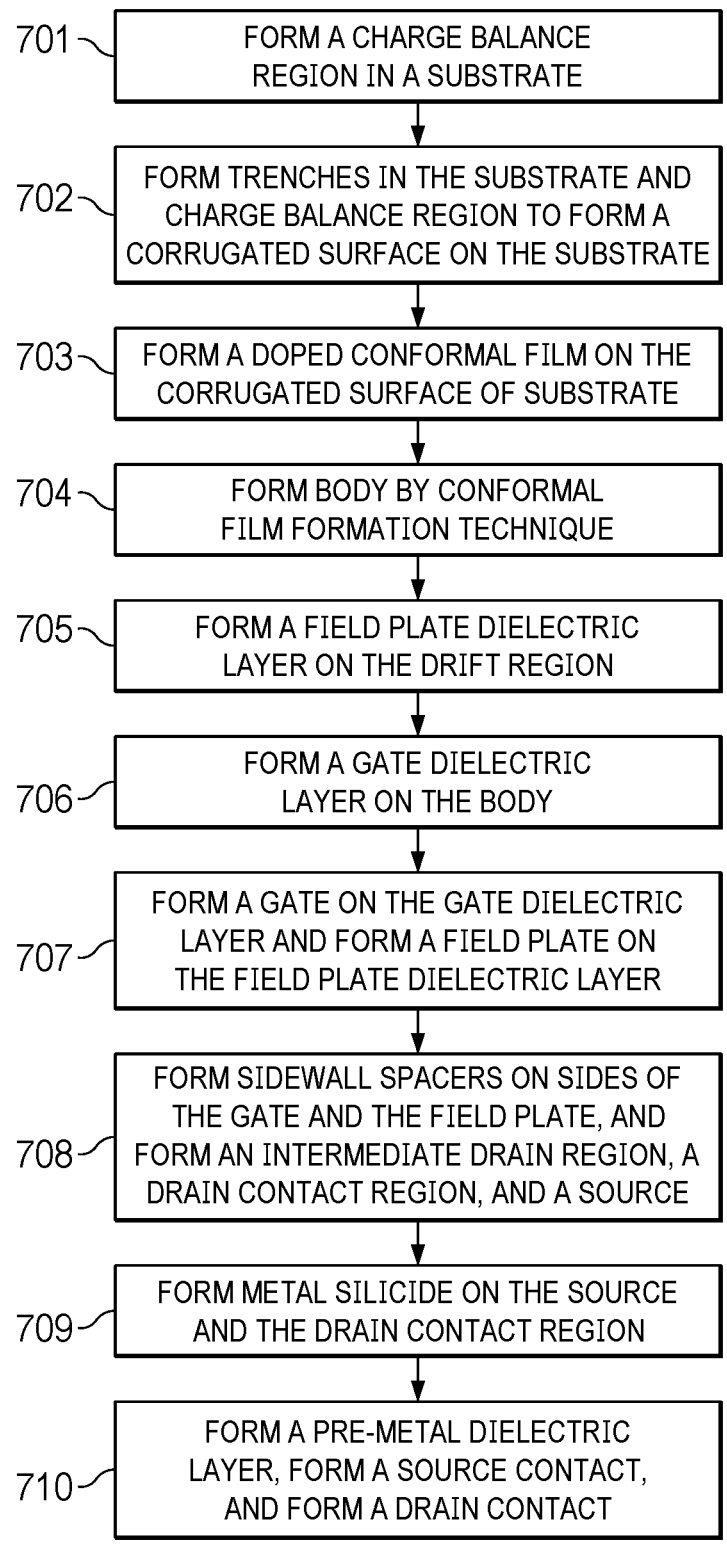
FIG. 13 is a flow chart illustrating an example method for forming the semiconductor structure described herein.
Figure 14:
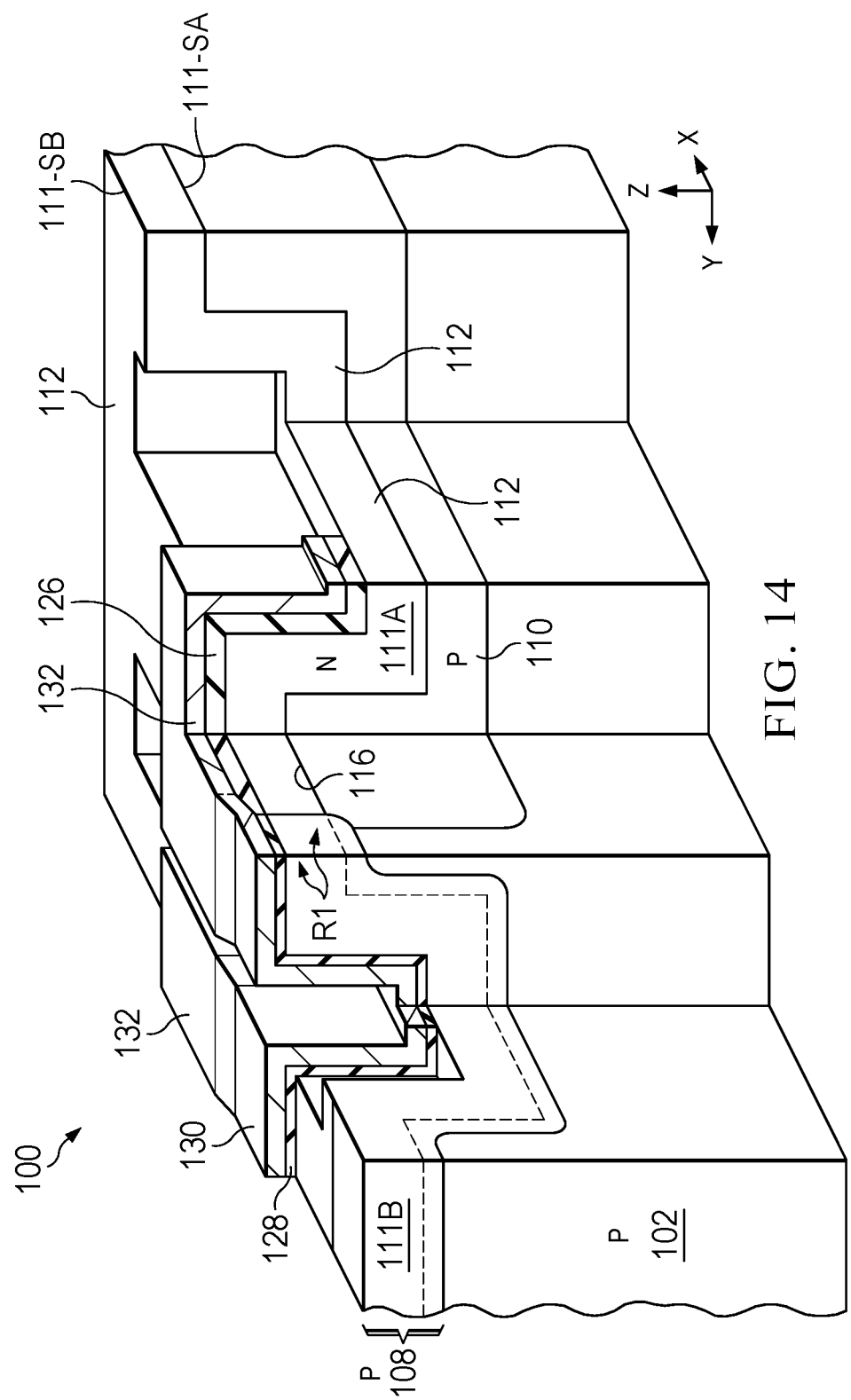
FIG. 14 is another three-dimensional, cut-away view of the semiconductor structure illustrating another example of forming body by conformal doping and using gate and field plate as a mask.

FIGS. 1 to 12 illustrate 3D cross-sectional views of various stages of the formation of the example 3D semiconductor device (such as a folded DEMOS transistor device), and FIG. 13 illustrates an example method of forming the 3D semiconductor device. FIG. 4 illustrates an example of forming body by conformal doping and with a tri-level mask. FIG. 14 illustrates another example of forming body by conformal doping and using gate and field plate as a mask.

Figure 1:
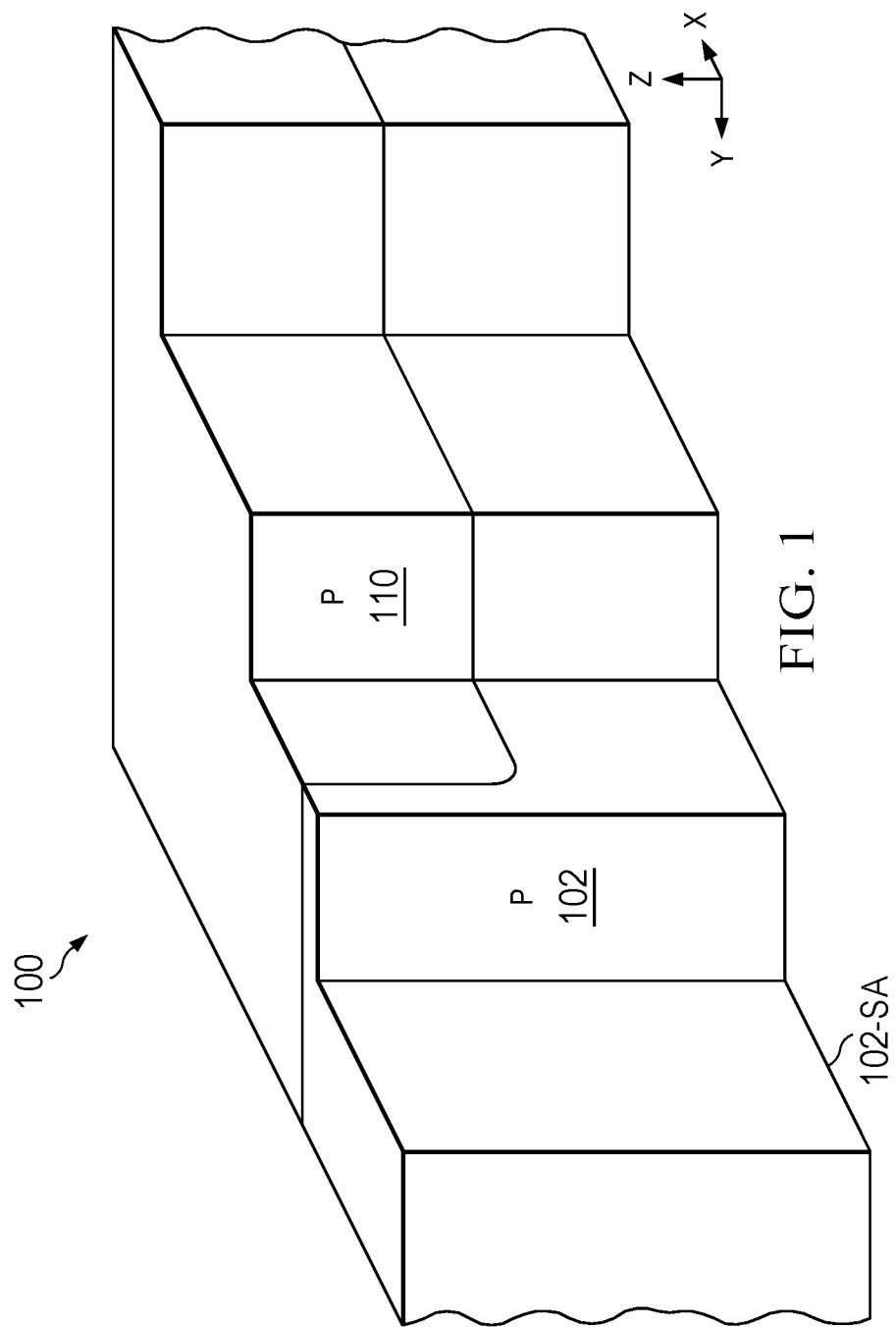
FIG. 1 is a three-dimensional, cut-away view of a semiconductor structure in which a charge balance region is formed in a substrate according to the described examples.

Referring to FIG. 1, the semiconductor device 100 is formed in and on a substrate 102 (e.g., a semiconductor substrate) that includes a semiconductor material, such as silicon. The substrate 102 may be implemented as a semiconductor wafer that includes other semiconductor devices, not shown. The semiconductor material of the substrate 102 may have a first conductivity type (P-type in the example of FIG. 1). In some examples, the semiconductor material of substrate 102 have an average resistivity of 10 ohm-cm to 100 ohm-cm.

The structure shown in each of FIGS. 1-12 is termed a "semiconductor device," and will be referred to by the number 100, even though the structures are not completely formed until some of the last stages of formation described herein. This is done primarily for the convenience of the reader. FIG. 1 also illustrates a coordinate system having X, Y, and Z axes. The X-axis and the Y-axis are orthogonal to each other and are parallel to a plane of the substrate 102, e.g., a surface 102-SA of the substrate 102. The X and Y-axes are thus referred to as "in-plane direction," The Z-axis is perpendicular to the X and Y-axes and thus perpendicular to the plane of the substrate 102. Accordingly, the Z-axis is referred to as an "out-of-plane direction."

In some examples (such as examples of FIGS. 1 to 12), the 3D semiconductor device 100 is or includes an n-channel folded DEMOS transistor device. In other examples, the 3D semiconductor device 100 is or includes a p-channel folded DEMOS transistor device, and may be formed by appropriate changes in polarities of dopants. In certain examples, a folded (or corrugated) structure can also be used to make lateral double diffused or LDMOS structures, which are a particular type of DEMOS, in both N and P polarities.

Referring to FIG. 1, a charge balance region 110 of the semiconductor device 100 is formed in the substrate 102 (Step 701 of FIG. 13). The charge balance region 110 may have the first conductivity type (e.g., P-type). In one example, the charge balance region 110 may be formed by implanting first conductivity type dopants into the substrate 102, using a charge balance implant mask (not shown), followed by heating the semiconductor material of the substrate and the implanted dopants, so that the first conductivity type dopants become activated.

In this description, the term average net concentration of first conductivity type dopants refers to an average concentration of the first conductivity type dopants minus an average concentration of second conductivity type dopants, where the second conductivity type dopants provide a second conductivity type that is opposite from the first conductivity type. In the examples of FIGS. 1 to 13, the first conductivity type is p-type, and the second conductivity type is n-type. In other examples, the first conductivity type is n-type, and the second conductivity type is p-type. In one example, p-type dopants include at least one of boron, gallium, or indium. In certain examples, n-type dopants include at least one of phosphorus, arsenic, or antimony.

Referring to FIG. 2, trenches 114 are formed in the substrate 102 and charge balance region 110, so as to form a corrugated surface 116 (e.g., a corrugated top surface) of the substrate 102 (Step 702 of FIG. 13). In the examples of FIG. 2, the trenches 114 extend partway through the substrate 102 and partway through the charge balance region 110 along the Z direction, and terminate in the substrate 102 and in the charge balance region 110. Other configurations of the trenches 114 with respect to the substrate 102 and the charge balance region 110 are within the scope of present disclosure. In the example of FIG. 2, the trenches 114 are formed by an etch or etch process 2100, such as a reactive ion etch (RIE) process using fluorine radicals. In the example of FIG. 2, there are fins 115 between trenches 114. The corrugated surface 116 is a surface of the substrate 102 and extends on trenches 114 and fins 115.

The corrugated surface 116 includes multiple portions. In the examples of FIG. 2, the corrugated surface 116 includes first portions 118 (e.g., an upper portion), second portions 120 (e.g., a lower portion, where the upper portion is higher than the lower portion along +Z direction), third portions 122 (e.g., a first side portion) extending from the first portions 118 to the second portions 120, and fourth portions 124 (e.g., a second side portion) extending from the first portions 118 to the second portions 120. The first portions 118 are portions of the fins 115 of the substrate 102 (e.g., top portions of the fins 115). The second portions 120 are in the trenches 114 (e.g., bottoms of the trenches 114). The third portions 122 and fourth portions 124 are the sidewalls of the fins 115 and/or trenches 114.

The first portions 118 may have a first edge 118-E1 and a second edge 118-E2. The second portions 120 may have a first edge 120-E1 and a second edge 120-E2. A third portion 122 may extend from the second edge 118-E2 of the first portion 118 to the first edge 120-E1 of the second portion 120 and couple the first portion 118 to the second portion 120; and the forth portion 124 may extend from the second edge 120-E2 of the second portion 120 to a first edge of an adjacent first portion 118, and couple the second portion 120 to the adjacent first portion 118.

The second portion 120 is depicted in FIG. 2 as flat, but can be rounded for specific device improvements to reduce electric fields at corners, or due to non-uniformity in removal of the material from the substrate 102 to form the trenches 114. In certain examples, the third portions 122 and the fourth portions 124 can be angled at 84 degrees to 88 degrees with respect to the first portion 118, to facilitate subsequent formation of layers in the trenches 114.

FIG. 3 illustrates forming a doped conformal film on the corrugated surface 116 (Step 703 of FIG. 13). Referring to FIG. 3, a conformal film 111 is formed on the corrugated surface 116 of the substrate 102. The conformal film 111 is conformal with the corrugated surface 116, in that the conformal film 111 has a shape (e.g., contour) following the corrugated shape (e.g., corrugated contour) of the corrugated surface 116. In the example of FIG. 3, the conformal film 111 thus is also corrugated; and the conformal film 111 has a first corrugated surface 111-SA and a second opposing corrugated surface 111-SB. The first corrugated surface 111-SA and the second opposing corrugated surface 111-SB each are conformal with the corrugated surface 116, and thus follow the corrugated shape of the corrugated surface 116. The conformal film 111 has a second conductivity type (e.g., N-type), opposite from the first conductivity type. In the example of FIG. 3, the conformal film 111 has a uniform thickness T-111.

The conformal film 111, the first surface 111-SA, and the second surface 111-SB are corrugated and include multiple portions, such as first, second, third, and fourth portions. In the example of FIG. 3, the conformal film 111 includes first portions 171 (e.g., an upper portion), second portions 172 (e.g., a lower portion), third portions 173 (e.g., a first side portion) extending from first portions 171 to second portions 172, and fourth portions 174 (e.g., a second side portion) extending from first portions 171 to second portions 172. The first portions 171 of the conformal film 111 are on or over respective first portions 118 of the corrugated surface 116; the second portions 172 of the conformal film 111 are on or over respective second portions 120 of the corrugated surface 116; third portions 173 of the conformal film 111 are on (or attached to or coupled to) respective third portions 122 of the corrugated surface 116; and fourth portions 174 of the conformal film 111 are on (or attached to or coupled to) respective fourth portions 124 of the corrugated surface 116.

The first portions 171 may have a first edge 171-E1 and a second edge 171-E2. The second portions 172 may have a first edge 172-E1 and a second edge 172-E2. The third portion 173 may extend from the second edge 171-E2 of the first portion 171 to the first edge 172-E1 of the second portion 172 and couple the first portion 171 to the second portion 172; and the forth portion 174 may extend from the second edge 172-E2 of the second portion 172 to a first edge of an adjacent first portion 171, and couple the second portion 172 to the adjacent first portion 171.

In some examples, a width T-171 of the first portions 171 of the conformal film 111 has a value in a range of 40 nm to 400 nm; a width T-172 of the second portion 172 of the conformal film 111 has a value in a range of 40 nm to 400 nm; a height T-173 of the third portion 173 of the conformal film 111 has a value in a range of 200 nm to 2000 nm; and a height T-174 of the fourth portion 174 of the conformal film 111 has a value in a range of 200 nm to 2000 nm. Other ranges for widths T-171, T-172 and heights T-173, T-174 may be chosen according to various application scenarios, such as ranges with smaller widths and larger heights (e.g., deeper corrugations), accentuating the 3D nature.

The second portions 172 of the conformal film 111 is depicted in FIG. 3 as flat, but can be rounded. In certain examples, the third portions 173 and the fourth portions 174 of the conformal film 111 (e.g., of the surface 111-SB) can be angled with an angle at 84 degrees to 88 degrees with respect to the upper portion 171 (e.g., of the surface 111-SB), to facilitate subsequent formation of layers in the trenches 114.

The doped conformal film 111 can be formed by a conformal film formation technique, such as epitaxy growth using CVD or other suitable conformal film formation technique. In some examples, conformal film formation technique includes CVD, plasma-enhanced chemical vapor deposition (PECVD), atomic layer deposition, vapor phase doping, gas phase doping, spin on (liquid) phase doping, and/or other suitable technique for forming a conformal film. In some examples, CVD can include depositing a new doped layer on a current layer using chemical vapor, or doping a current layer with dopants to convert the current layer into a layer with added dopants using chemical vapor; and PECVD can include depositing a new doped layer on a current layer using chemical vapor and plasma-enhancement, or doping a current layer with dopants to convert the current layer into a layer with added dopants using chemical vapor and plasma-enhancement. In certain examples, the conformal film formation technique can be an epitaxy film formation technique. In contrast, if ion implantation is used to form a film on the corrugated surface 116 of the substrate 102, fins 115 may block implantation beams.

In certain examples, over-etch (or over-etching) is performed on trenches. In some examples, with an epitaxial growth, the over-etch is performed with a plasma or aqueous isotropic process to make room for the epitaxial growth. In other examples, masks can be biased to allow for the requisite etching to be less of an over-etch and more closely resembling the photoresist pattern. Over-etching can be performed in either a separate or integral manner. For example, over-etching can be included in the etch process 2100, or can be in addition to the etch process 2100. In some examples, the trench mask/resist/etched geometry is simply enlarged to allow for the epitaxial growth. For example, the lateral etch size for trench is 200 nm, the epitaxial deposition thickness is 50 nm per side, and the lateral size of trench is 100 nm (=200 nm-2*50 nm) after epitaxial deposition). In another example, the masking and initial etching is performed, the hard mask is removed, and the exposed area is etched without the specific mask pattern in place, though other regions would be blocked. This allows the etching of the tops of the fins as well as the sides and bottom of the trench between them, resulting in the surface post-epitaxial deposition being either near planar on top of the fin or recessed to allow for additional processing.

Reference numbers may be used to refer to elements described in the detailed description section of the specification and the drawings or may be used to refer to dimension of the element. For examples, reference numbers 111, 110 or 100 are used to refer to elements or components shown in FIGS. 1-12, rather than indicating "Miller Indices" associated with crystal orientation.

In some examples, conformal film formation technique can be non-selective epitaxy growth. In other examples, conformal film formation technique can be selective epitaxy growth; and the selective epitaxy growth can be a process of depositing silicon, or silicon and dopants/crystal modification elements such as boron, phosphorus, arsenic, germanium, carbon on (e.g., only on) the exposed silicon surface, and not depositing on other surfaces (such as oxide regions). In one example, the selective epitaxy growth is performed by selection of temperature, reactant concentration and pressure, and surface preparation to utilize differential kinetics of silicon surfaces as compared to oxide or nitride surfaces. With the selective epitaxy growth, silicon film can be deposited on desired regions (such as a silicon region) and not deposited on non-desired and unrelated regions (such as oxide or nitride regions).

In some examples, a portion 111A (also referred to as region 111A) of the doped conformal film 111 serves or operates as a drift region 112; and another portion 111B (also referred to as region 111B) of the conformal film 111 can be further converted or changed by doping (such as conformal doping) to serve as, e.g., body or a portion of body (shown in FIG. 4 and described below).

In certain examples, the charge balance region 110 has an average net concentration of first conductivity type dopants of $1\times10^{16}$ cm$^{-3}$ to $1\times10^{18}$ cm$^{-3}$; and the drift region 112 has an average net concentration of second conductivity type dopants of $1\times10^{16}$ cm$^{-3}$ to $1\times10^{18}$ cm$^{-3}$.

In some examples, the conformal film formation technique such as epitaxy CVD can be used to form the doped conformal film 111 and the drift region 112 of the second conductivity type on the charge balance region 110 of the first conductivity type, where introduced dopants of the second conductivity type do not need to exceed dopants of the first conductivity type of the charge balance region 110 for having the opposite conductivity type; and accordingly, the semiconductor device 100 (such as a power device) can have an improved reduced-surface-field (RESURF) effect and suppressed or reduced snapback. In contrast, introduced dopants of the second conductivity type need to exceed dopants of the first conductivity type of the charge balance region 110 if implantation is used to change the first conductivity type of the charge balance region 110 to the second conductivity type of a drift region.

The drift region 112 formed using the conformal film formation technique such as epitaxy CVD can have improved control of doping, which allows improved control of electric field and field gradients, e.g., for high-voltage (such as higher than 5 volts) applications and devices. The improved control of doping of the drift region 112 can reduce breakdown and leakage of the device, and can increase and thus improve hot carrier performance and safe operating area of the device. Further, the working voltage and/or the working current in on-state for a given size device can be increased with the improved control of doping of the drift region 112 using the conformal film formation technique.

In some examples, the doped conformal film 111 and the drift region 112 can be or include doped epitaxial film or layer, formed epitaxially on the corrugated surface 116 by using epitaxy film formation technique, such as epitaxy CVD.

In certain examples, using the conformal film formation technique such as epitaxy CVD to form the doped drift region 112, the drift region 112 and the charge balance region 110 can have a sharp transition in net doping concentrations, as compared to using implantation technique to form the doped drift region.

In some examples of this description, using the conformal film formation technique such as epitaxy CVD to form the doped drift region 112 for the sharp transition, a doping concentration change (e.g., doping concentration difference) between the net doping concentration of the drift region 112 and the net doping concentration of the charge balance region 110 is in a range of $1\times10^{14}$ cm$^{-3}$ to $1\times10^{20}$ cm$^{-3}$ for a distance of equal to or less than 100 nm. In certain examples, using the conformal film formation technique such as epitaxy CVD to form the doped drift region 112 for the sharp transition, a doping concentration change between the net doping concentration of the drift region 112 and the net doping concentration of the charge balance region 110 is in a range of $1\times10^{14}$ cm$^{-3}$ to $1\times10^{18}$ cm$^{-3}$ for a distance of equal to or less than 100 nm. In one example, using the conformal film formation technique such as epitaxy CVD to form the doped drift region 112 for the sharp transition, a doping concentration change between the net doping concentration of the drift region 112 and the net doping concentration of the charge balance region 110 is in a range of $1\times10^{16}$ cm$^{-3}$ to $1\times10^{18}$ cm$^{-3}$ for a distance of equal to or less than 100 nm. The doping concentration change includes the change in conductivity types of net doping concentrations. For example, if the net doping concentration of the charge balance region 110 is L cm$^{-3}$ of the first conductivity type, and if the net doping concentration of the drift region 112 is M cm$^{-3}$ of the second conductivity type that is opposite to the first conductivity type, where L and M each are positive numbers, then the doping concentration change between the net doping concentration of the drift region 112 and the net doping concentration of the charge balance region 110 is (L+M) cm$^{-3}$.

In some examples, a sharp transition of junctions can suppress or reduce parasitic effects, because abrupt and possibly retrograded junctions, that can be formed by epitaxy and similar conformal techniques, can, for example, reduce the depletion on the heavily doped side of a junction, and thus may reduce the capacitance and high current roll off of conduction.

In certain examples, with the conformal film formation technique such as epitaxy CVD, the doped conformal film 111 and the drift region 112 can be or include silicon-germanium (SiGe) film (such as doped SiGe film), and the SiGe film can provide a higher mobility than a silicon film. Depending on the desired doping of the film, carbon and other elements may also be incorporated to improve the gradients of the doping.

FIG. 4 illustrates forming body 108 by conformal film formation technique, such as conformal doping using CVD (Step 704 of FIG. 13). In some examples, body 108 is formed by doping conformally first conductivity type dopants into portion 111B of the conformal film 111 to change portion 111B of the conformal film 111 from the second conductivity type to the first conductivity type, and doping conformally first conductivity type dopants into a portion of the substrate 102 to achieve desired doping concentration of first conductivity type. A thickness of body 108 may be chosen according to various application scenarios. In the example of FIG. 4, the thickness of body 108 is greater than the thickness (T111) of portion 111B. In other examples, the thickness of body 108 is the same as or approximately the same as the thickness (T111) of portion 111B.

During the conformal doping, portion 111A of the conformal film 111 can be protected by a tri-level mask M1, such that dopants are not doped into portion 111A of the conformal film 111. The tri-level mask M1 can define a doping region for the underneath corrugated film 111 with corrugated surface (such as 111) to expose portion 111B of the conformal film 111 for doping, such that dopants are doped into portion 111B of the conformal film 111 and the portion of the substrate 102 corresponding to the doping region.

The tri-level mask M1 includes a planarization layer M1-A having a thickness sufficient to planarize over the underneath corrugated surface (such as 111-SB), an image transfer layer M1-B on planarization layer M1-A, and an imaging layer M1-C on image transfer layer M1-B. In some examples, the planarization layer M1-A includes a resin layer having a thickness sufficient to planarize on the underneath corrugated surface (such as 111), and the image transfer layer M1-B includes an organic or inorganic resin. With the planarization layer M1-A and the image transfer layer M1-B, a thin photoresist imaging layer M1-C can be formed on the image transfer layer M1-B, so as to achieve high lithographic resolution in the imaging layer M1-C. The resulting improved-resolution openings can further be transferred to the image transfer layer M1-B and planarization layer M1-A to define and expose the doping region for conformal doping.

The portion 111B becomes a portion of body 108; and portion 111A operates as a drift region 112. Accordingly, first corrugated surface 111-SA and the second corrugated surface 111-SB of the conformal film 111 in the drift region 112 can also be referred to as first surface 112-SA and second surface 112-SB of drift region 112, respectively. In the example of FIG. 4, body 108 include portion 111B that extend continuously along the first portions 118, second portions 120, third portions 122, and fourth portions 124 of the corrugated surface 116. In some examples, the thickness T-111 of the conformal film 111 (and of the drift region 112) has a value in a range of 50 nm to 500 nm.

The drift region 112 contacts the body 108 along (e.g., continuously along) first portions 118, second portions 120, third portions 122, and fourth portions 124 of the corrugated surface 116, and along (e.g., continuously along) first portions 171, second portions 172, third portions 173, and fourth portions 174 of the conformal film 111 (or the drift region 112). The charge balance region 110 contacts the drift region 112 continuously along first portions 118, second portions 120, third portions 122, and fourth portions 124 of the corrugated surface 116, and continuously along first portions 171, second portions 172, third portions 173, and fourth portions 174 of the conformal film 111 (or the drift region 112). The drift region 112 contacts the body 108 at a contact portion (e.g., a contact boundary) 176 therebetween, and the contact portion 176 has a corrugated shape on or over of the corrugated surface 116 and following the corrugated shape (e.g., corrugated contour) of the corrugated surface 116. In certain examples, the drift region 112 is an epitaxial region that includes at least one of silicon, germanium, or silicon-germanium.

Figure 5:
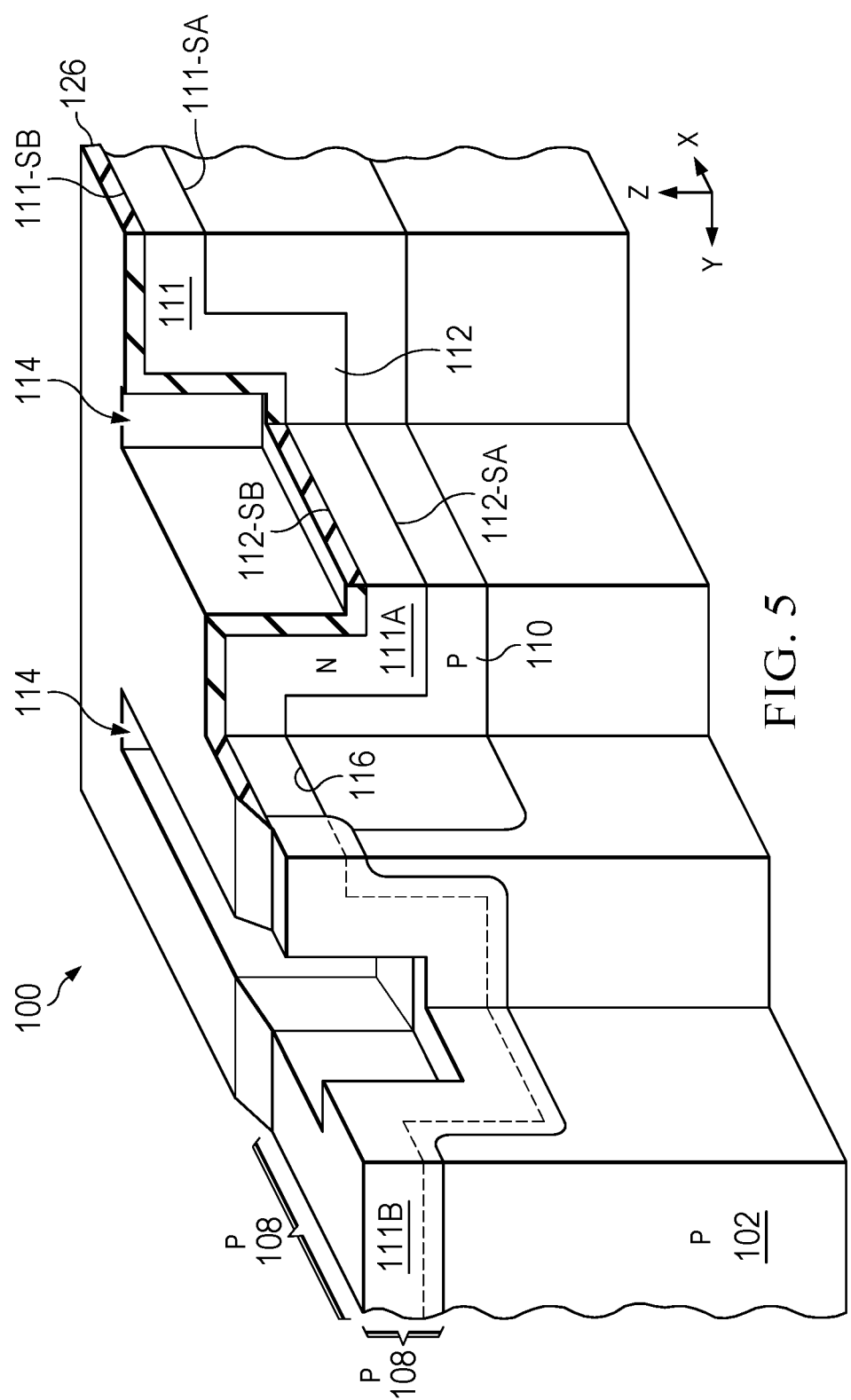
FIG. 5 is a further three-dimensional, cut-away view of the semiconductor structure in which a field plate dielectric layer is formed on a drift region, according to the described examples.

FIG. 5 illustrates forming a field plate dielectric layer 126 on the drift region 112 (Step 705 of FIG. 13), extending continuously along first portions 118, second portions 120, third portions 122, and fourth portions 124 of the corrugated surface 116 of the substrate 102, and continuously along first portions 171, second portions 172, third portions 173, and fourth portions 174 of the corrugated conformal film 111 (or the corrugated drift region 112). The field plate dielectric layer 126 extends proximate to the body 108, and may partially overlap the body 108. The field plate dielectric layer 126 may be formed by forming a first sublayer on the drift region 112 and forming a second sublayer on the first sublayer (the first and second sublayers are not individually shown). In some examples, the first sublayer of the field plate dielectric layer 126 includes silicon dioxide, and has a thickness in a range of 5 nanometers to 20 nanometers. In certain examples, the first sublayer of the field plate dielectric layer 126 is formed by a thermal oxidation process, to provide a stable interface with the drift region 112. In certain examples, the second sublayer of the field plate dielectric layer 126 includes silicon dioxide, and has a thickness in a range of 30 nanometers to 60 nanometers, and is formed by a plasma enhanced chemical vapor deposition (PECVD) process using tetraethoxysilane (TEOS), also referred to as tetraethyl orthosilicate.

A field plate dielectric etch mask, not shown, may be formed over the second sublayer, covering an area for the field plate dielectric layer 126. The first sublayer and the second sublayer are removed where exposed by the field plate dielectric etch mask, to form the field plate dielectric layer 126. The first sublayer and the second sublayer may be removed where exposed by the field plate dielectric etch mask by a wet etch process using a dilute buffered aqueous solution of hydrofluoric acid, to provide a tapered edge profile on the field plate dielectric layer 126. The tapered edge profile may provide a smoothly continuous electric field in the drift region 112 during operation of semiconductor device 100. The field plate dielectric etch mask is subsequently removed. Other structures, compositions, and methods of forming the field plate dielectric layer 126 are within the scope of this example.

Figure 6:
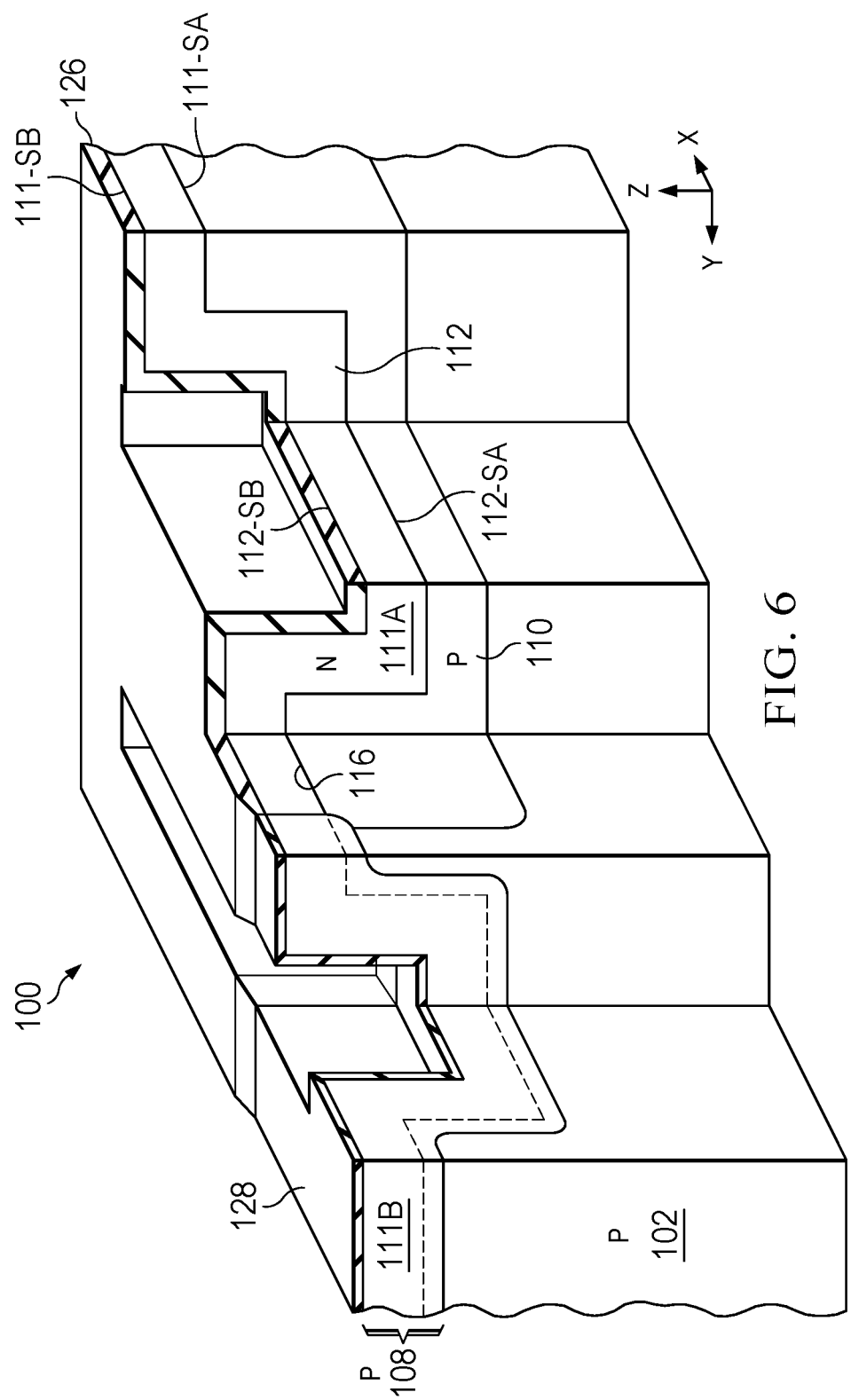
FIG. 6 is a further three-dimensional, cut-away view of the semiconductor structure in which a gate dielectric layer is formed on the body, according to the described examples.

FIG. 6 illustrates forming a gate dielectric layer 128 on the body 108 (Step 706 of FIG. 13), extending continuously along first portions 118, second portions 120, third portions 122, and fourth portions 124 of the corrugated surface 116 of the substrate 102, and continuously along first portions 171, second portions 172, third portions 173, and fourth portions 174 of the corrugated conformal film 111 (or portion 111B). The gate dielectric layer 128 extends to the field plate dielectric layer 126. In one example, the gate dielectric layer 128 is formed by a thermal oxidation process, and includes silicon dioxide, with a thickness in a range of 3 nanometers to 10 nanometers. In certain examples, nitrogen is introduced into the gate dielectric layer 128 by exposing the gate dielectric layer 128 to a nitrogen-containing plasma. In certain examples, the gate dielectric layer 128 includes high dielectric constant material, such as hafnium oxide, zirconium oxide, or tantalum oxide.

Figure 7:
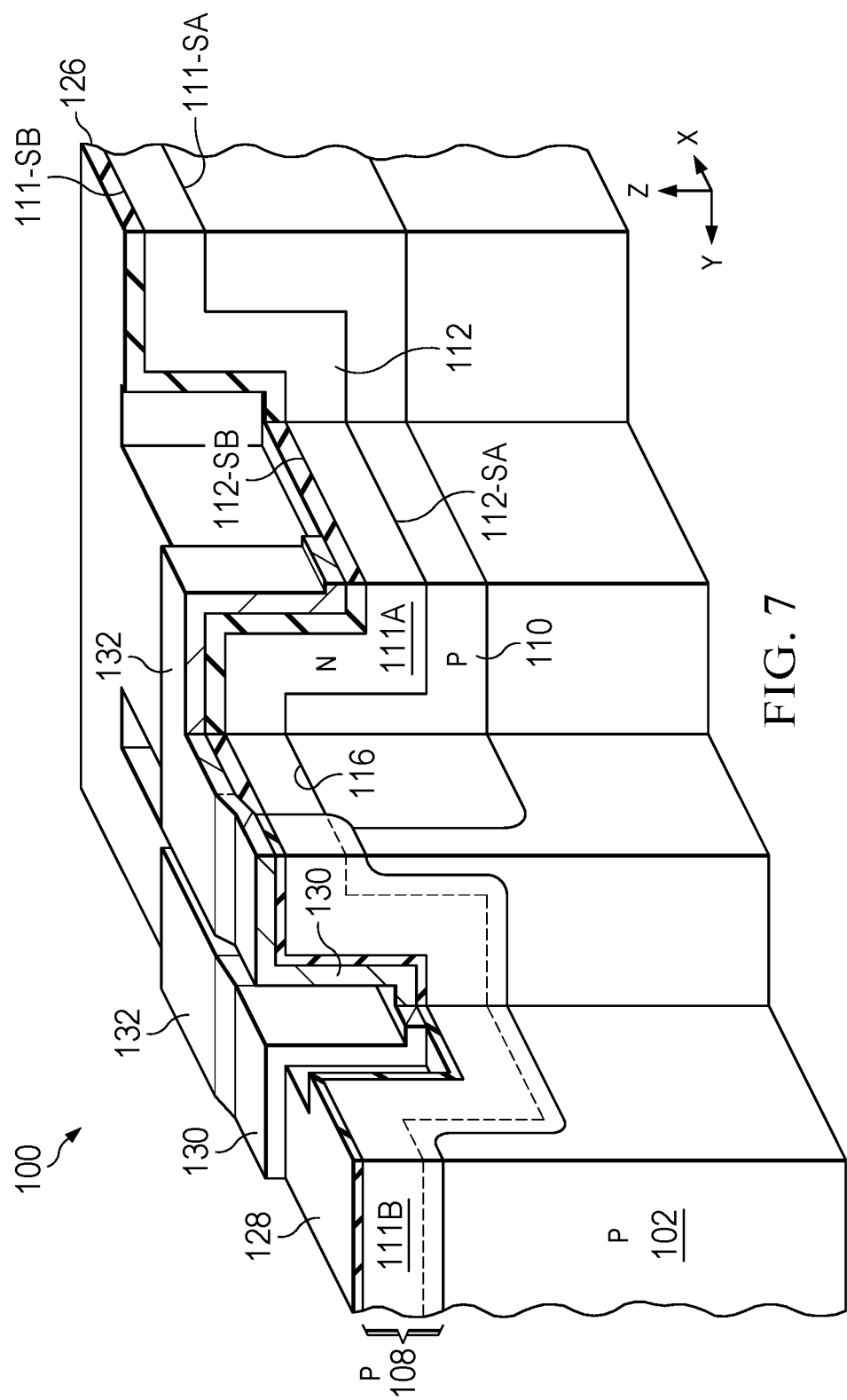
FIG. 7 is a further three-dimensional, cut-away view of the semiconductor structure in which illustrates forming a gate on the gate dielectric layer and forming a field plate on the field plate dielectric layer, according to the described examples.

FIG. 7 illustrates forming a gate 130 on the gate dielectric layer 128 and forming a field plate 132 on the field plate dielectric layer 126 (Step 707 of FIG. 13). In the example of FIG. 7, the gate 130 is continuous with or integrated with the field plate 132. For example, the gate 130 and the field plate 132 can be an integrated piece. The gate 130 and the field plate 132 may be formed concurrently, by forming a gate/field plate layer, not shown, on the gate dielectric layer 128 and on the field plate dielectric layer 126, e.g., using chemical vapor deposition (CVD) of polycrystalline silicon, followed by chemical-mechanical planarization (CMP). The gate/field plate layer may include polycrystalline silicon, also referred to as polysilicon, or other suitable gate material such as titanium nitride or titanium silicide. A gate/field plate etch mask is formed over the gate/field plate layer and covers areas for the gate 130 and the field plate 132. The gate/field plate layer is removed (e.g., using plasma etching) where exposed by the gate/field plate etch mask, leaving the covered areas on the gate dielectric layer 128 and on the field plate dielectric layer 126 to provide the gate 130 and the field plate 132. The gate/field plate etch mask is subsequently removed. The gate 130 extends on the gate dielectric layer 128 continuously along first portions 118, second portions 120, third portions 122, and fourth portions 124 of the corrugated surface 116, and continuously along first portions 171, second portions 172, third portions 173, and fourth portions 174 of the corrugated conformal film 111 (or portion 111B). The field plate 132 extends on the field plate dielectric layer 126 continuously along first portions 118, second portions 120, third portions 122, and fourth portions 124 of the corrugated surface 116, and continuously along first portions 171, second portions 172, third portions 173, and fourth portions 174 of the corrugated conformal film 111 (or the drift region 112).

Figure 8:
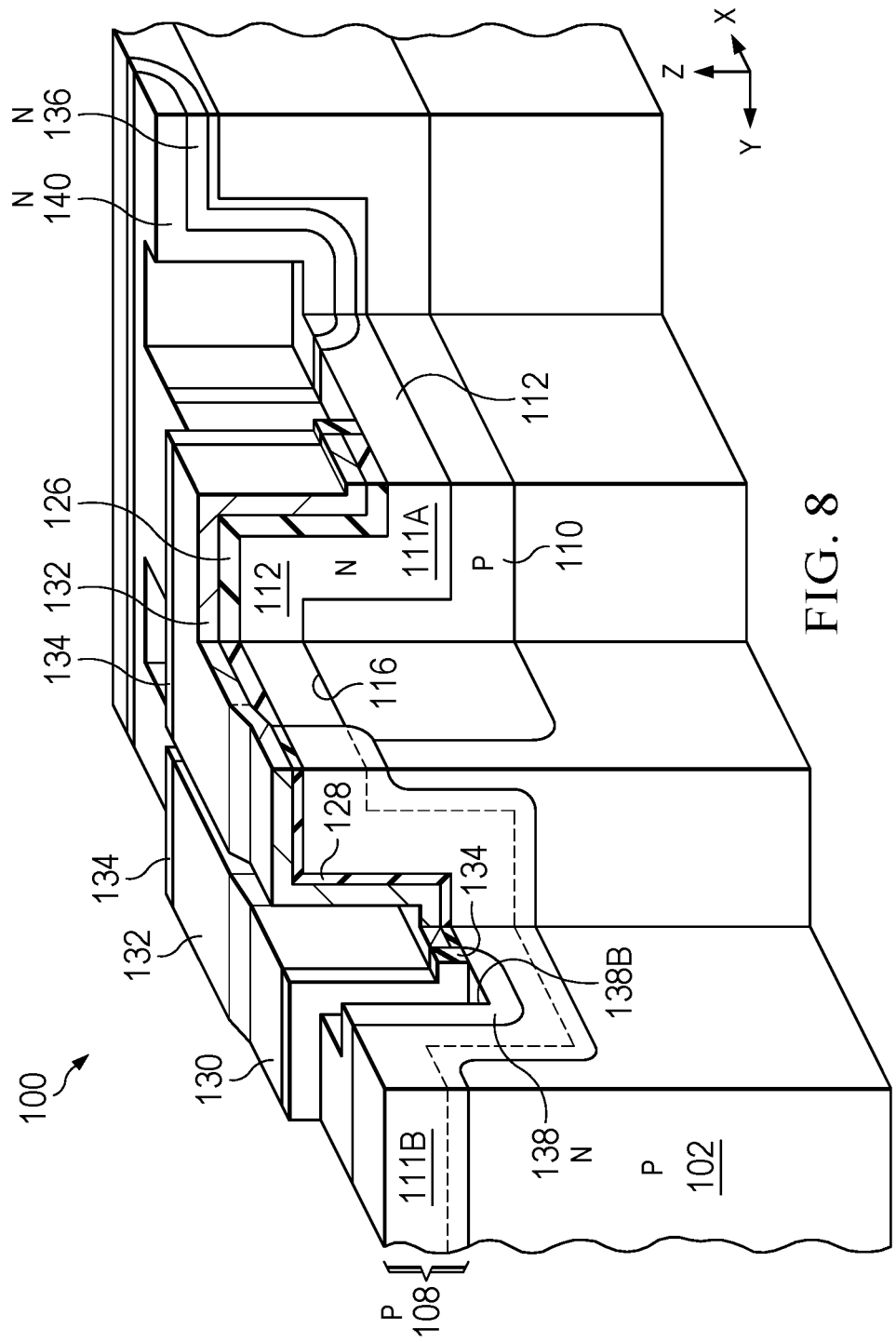
FIG. 8 is a further three-dimensional, cut-away view of the semiconductor structure in which sidewall spacers are formed on sides of the gate and the field plate, according to the described examples.

In the example of FIG. 8, the gate dielectric layer 128 can be removed where exposed by the gate 130, and the field plate dielectric layer 126 can be removed where exposed by the field plate 132. A protective oxide layer, not shown, may be formed on portions 111B and 111A and in areas where the gate dielectric layer 128 and the field plate dielectric layer 126 are removed.

FIG. 8 further illustrates forming sidewall spacers 134 on sides of the gate 130 and the field plate 132 (Step 708 of FIG. 13). In some examples, the sidewall spacers 134 include one or more sidewall layers, and a sidewall layer includes at least one of silicon dioxide, silicon nitride, or silicon oxynitride. In certain examples, for forming the sidewall spacers 134, one or more conformal layers of at least one of silicon dioxide, silicon nitride, or silicon oxynitride on or over portions 111B and 111A are formed by one or more PECVD processes, using tetraethoxysilane (TEOS) or bis(tertiary-butyl-amino)silane (BTBAS). In certain examples, a hard mask is over the formed conformal layers, and a tri-level "silicide blocking" mask is used to cover the regions where the sidewall spacer is desired, so as to prevent removal of the materials of the hard mask and sidewall spacer along the topography and of the respective regions covered by tri-level "silicide blocking" mask. The hard mask is patterned by the tri-level processing, and is used to block doping or silicidation. The hard mask and subsequent conformal layers can be etched by isotropic etching to allow the formation of conformal sidewall spacers 134. Accordingly, portions of the conformal layers may be removed, leaving the conformal layers on the sides of the gate 130 and the field plate 132 to provide the sidewall spacers 134.

FIG. 8 further illustrates forming an intermediate drain region 136 that is adjacent to and contacts the drift region 112, opposite from the body 108. The intermediate drain region 136 has the second conductivity type, and may have an average net concentration of second conductivity type dopants that is 2 to 4 times the average net concentration of second conductivity type dopants of the drift region 112. The intermediate drain region 136 contacts the drift region 112 continuously along first portions 118, second portions 120, third portions 122, and fourth portions 124 of the corrugated surface 116, and continuously along first portions 171, second portions 172, third portions 173, and fourth portions 174 of the corrugated conformal film 111 (or the drift region 112). The intermediate drain region 136 may be formed by doping (e.g., conformally doping or implanting) second conductivity type dopants such as phosphorus or a combination of phosphorus and arsenic into portions of the drift region 112. The intermediate drain region 136 may reduce an electric field in the drift region 112 during operation of the semiconductor device 100, enabling operation of the semiconductor device 100 at a higher drain potential than a comparable transistor lacking an intermediate drain region.

FIG. 8 further illustrates forming a drain contact region 140. The drain contact region 140 is electrically coupled to the drift region 112. In the example of FIG. 8 in which the intermediate drain region 136 is formed, the drain contact region 140 is separated from the drift region 112 by the intermediate drain region 136, and is electrically coupled to the drift region 112 through the intermediate drain region 136. In other examples, the intermediate drain region 136 can be omitted, and the drain contact region 140 directly contacts the drift region 112, opposite from the body 108. In the example of FIG. 8, the drain contact region 140 is electrically coupled to the drift region 112, extends (or includes a portion that extends) continuously along first portions 118, second portions 120, third portions 122, and fourth portions 124 of the corrugated surface 116, and continuously along first portions 171, second portions 172, third portions 173, and fourth portions 174 of the corrugated conformal film 111 (or the drift region 112). The drain contact region 140 has the second conductivity type. The drain contact region 140 may be formed by doping (e.g., conformally doping or implanting) second conductivity type dopants such as phosphorus or a combination of phosphorus and arsenic into portions of the intermediate drain region 136 or portions of the drift region 112.

FIG. 8 further illustrates forming a source 138 that is adjacent to and contacts the body 108, opposite from the drift region 112. The source 138 has the second conductivity type. In the example of FIG. 8, the source 138 include a portion (such as a surface 138B of the source 138) extends continuously along (or parallel to) first portions 118, second portions 120, third portions 122, and fourth portions 124 of the corrugated surface 116.

The source 138 and the drain contact region 140 may be formed concurrently by doping (e.g., conformally doping or implanting) second conductivity type dopants. The source 138 and the drain contact region 140 have average net concentrations of second conductivity type dopants higher than the drift region 112. The source 138 may have average net concentrations of second conductivity type dopants of $1\times10^{19}$ cm$^{-3}$ to $2\times10^{21}$ cm$^{-3}$, and the drain contact region 140 may average net concentrations of second conductivity type dopants of $1\times10^{19}$ cm$^{-3}$ to $2\times10^{21}$ cm$^{-3}$, to provide low resistance connections to the semiconductor device 100, which can improve a current density of the semiconductor device 100.

Figure 9:
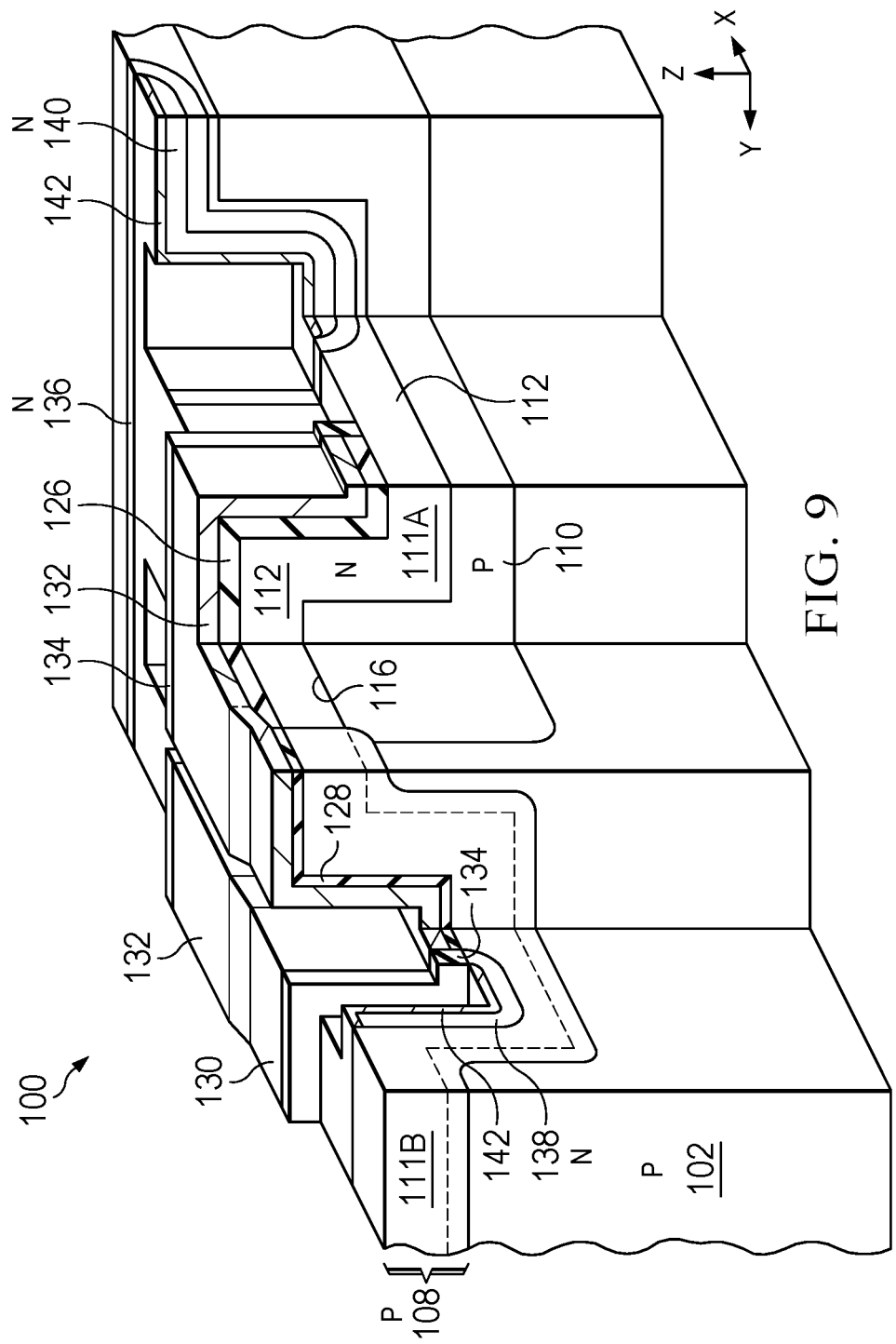
FIG. 9 is a further three-dimensional, cut-away view of the semiconductor structure in which metal silicide is formed on the source and the drain contact region, forming a drain contact region, and forming a source, according to the described examples.

FIG. 9 illustrates forming metal silicide 142 on the source 138 and the drain contact region 140 (Step 709 of FIG. 13). The metal silicide 142 may be formed by forming a metal layer, not shown, on the source 138 and the drain contact region 140, extending into the trenches 114 and contacting the source 138 and the drain contact region 140 continuously along first portions 118, second portions 120, third portions 122, and fourth portions 124 of the corrugated surface 116, and continuously along first portions 171, second portions 172, third portions 173, and fourth portions 174 of the conformal film 111. In some examples, the metal layer includes one or more metals suitable for forming the metal silicide 142, such as at least one of titanium, cobalt, nickel, or platinum. The metal layer may be formed by a sputter process, an ion plating process, or metal organic chemical deposition (MOCVD) process, to provide uniform coverage. The substrate 102 is heated, causing the metal in the metal layer to react with semiconductor (such as silicon) in the source 138 and the drain contact region 140, forming the metal silicide 142. Unreacted metal of the metal layer is removed by a wet etch process, leaving the metal silicide 142 on the source 138 and the drain contact region 140. In some examples, the gate 130 and the field plate 132 include polysilicon, the metal silicide 142 can also be formed on the gate 130 and the field plate 132. The metal silicide 142 may provide low resistance connections to the source 138 and the drain contact region 140. Having the metal silicide 142 extending continuously along first portions 118, second portions 120, third portions 122, and fourth portions 124 of the corrugated surface 116, and continuously along first portions 171, second portions 172, third portions 173, and fourth portions 174 of the conformal film 111 can provide uniform low resistance connections to the source 138 and the drain contact region 140.

Figure 10:
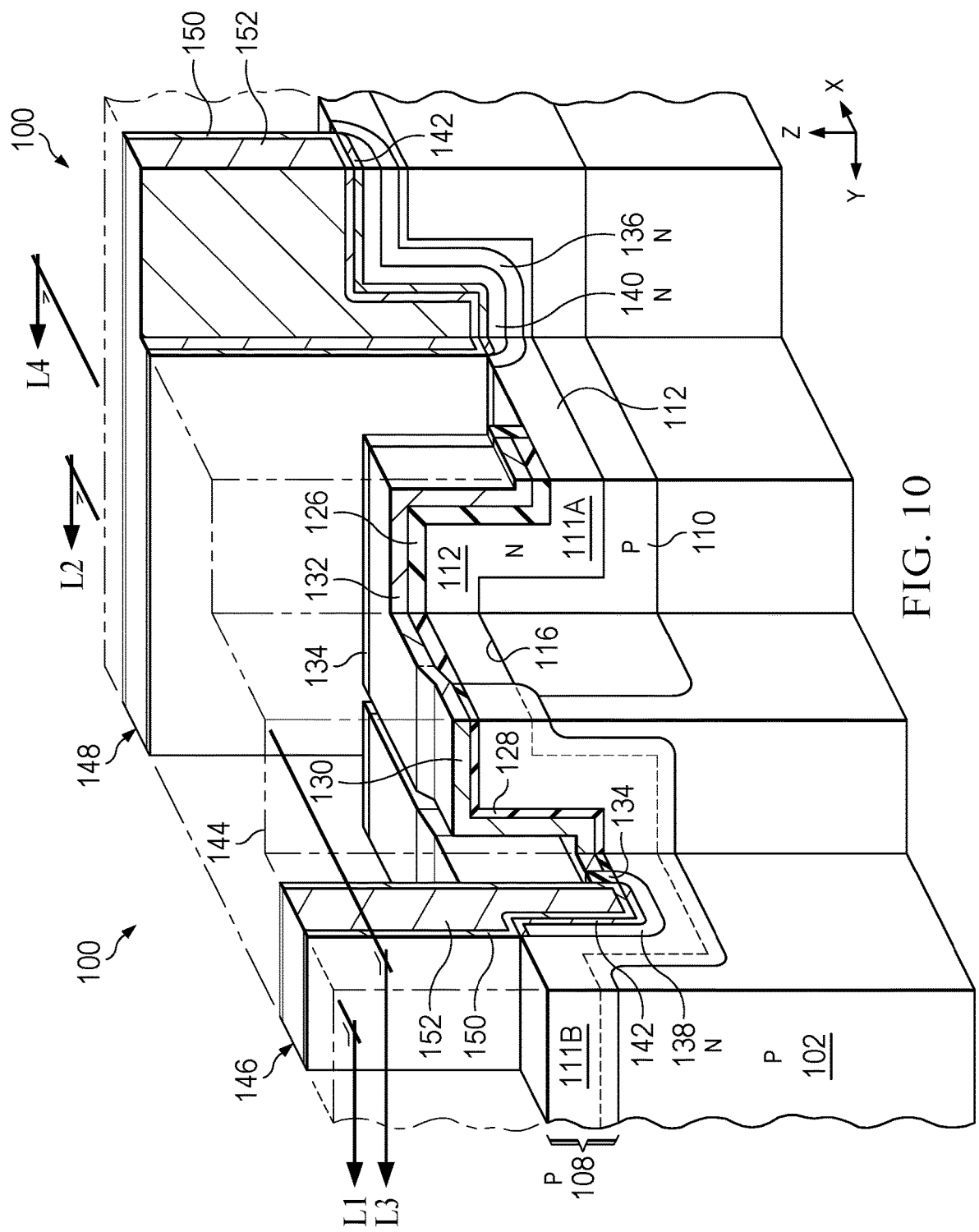
FIG. 10 is a further three-dimensional, cut-away view of the semiconductor structure in which a pre-metal dielectric (PMD) layer is formed, according to the described examples.

FIG. 10 illustrates forming a pre-metal dielectric (PMD) layer 144 extending over the substrate 102 (Step 710 of FIG. 13). In some examples, the PMD layer 144 includes a PMD liner, a PMD main layer formed on the PMD liner, and a cap layer formed on the PMD main layer. The PMD liner may include one or more layers of at least one of silicon dioxide, silicon nitride, or silicon oxynitride, and may be formed by a PECVD process or a low pressure chemical vapor deposition (LPCVD) process. The PMD main layer may include at least one of silicon dioxide, silicon dioxide with hydrogen, phosphosilicate glass (PSG), or borophosphosilicate glass (BPSG), and may be formed by a PECVD process, an atmospheric pressure chemical vapor deposition (APCVD) process, a high density plasma (HDP) process, or a high aspect ratio process (HARP) using ozone. The cap layer may include silicon nitride, silicon carbide, silicon carbide nitride, or other material suitable for a stop layer for a CMP process. In some examples, the cap layer is formed by a PECVD process.

FIG. 10 illustrates forming a source contact 146 on the metal silicide 142 on the source 138, and forming a drain contact 148 on the metal silicide 142 on the drain contact region 140. The source contact 146 and the drain contact 148 may be formed concurrently, by removing the PMD layer 144 from contact slots over the source 138 and the drain contact region 140 by a two-step RIE process, in which a first RIE process removes the cap layer and the PMD main layer, stopping on the PMD liner, and a second RIE process removes the PMD liner, stopping on the metal silicide 142. A contact liner 150 is formed on the metal silicide 142, and a contact fill layer 152 is formed on the contact liner 150. The contact liner 150 may include titanium and titanium nitride, and may be formed by a titanium sputter process followed by a titanium nitride ion plating process or a titanium nitride atomic layer deposition (ALD) process. The contact fill layer 152 may include tungsten, and may be formed by a tungsten MOCVD process in which tungsten hexafluoride is reduced initially by silane and subsequently by hydrogen.

The contact liner 150 and the contact fill layer 152 may extend over the PMD layer 144. A tungsten CMP process is used to remove the contact fill layer 152 and the contact liner 150 from over the PMD layer 144, leaving the contact fill layer 152 and the contact liner 150 in the contact slots to provide the source contact 146 and the drain contact 148. In the example of FIG. 10, the source contact 146 (or portions of source contact 146) and the drain contact 148 (or portions of drain contact 148) extend continuously along first portions 118, second portions 120, third portions 122, and fourth portions 124 of the corrugated surface 116, and continuously along first portions 171, second portions 172, third portions 173, and fourth portions 174 of the conformal film 111 (e.g., of portion 111B or of the drift region 112), which can provide more uniform current through semiconductor device compared to a comparable device having discrete contacts. The body 108 extends to (and includes) regions covered by the gate 130 and the gate dielectric layer 128 to provide channel regions for the device 100.

FIG. 11 illustrates a cross-sectional view of the semiconductor device of FIG. 10 across L1-L2 through one of the trenches 114. FIG. 12 illustrates another cross sectional view of the semiconductor device 100 of FIG. 10 across L3-L4 through one of the fins 115. the trenches 114 extend from the source 138 to the drain contact region 140.

In the example of FIG. 11, the source 138 can extend past the trenches 114. In other examples, the trenches 114 can extend past the source 138. In the example of FIG. 11, drain contact region 140 can extend past the trenches 114. In other examples, the trenches 114 can extend past the drain contact region 140. The charge balance region 110 extends adjacent to the drift region 112 and on one side of the drift region 112 that is opposite from the trench 114 (e.g., below the drift region 112 and under the corrugated surface 116). The source 138, the body 108, the gate dielectric layer 128, the gate 130, the field plate dielectric layer 126, the field plate 132, the drift region 112, the intermediate drain region 136, the drain contact region 140, the metal silicide 142, the source contact 146, and the drain contact 148 extend along the second portion 120 of the corrugated surface 116, and along second portion 172 of the corrugated conformal film 111 (e.g., of portion 111B or of the drift region 112).

The cross-sectional view of the semiconductor device 100 in FIG. 12 is through a plane between two adjacent trenches 114, across L3-L4. The charge balance region 110 extends along −Z direction (e.g., below the drift region 112) sufficiently deep to contact the drift region 112 along third portion 173 and fourth portion 174 of the corrugated conformal film 111 (e.g., of the drift region 112), where the third portion 173 and the fourth portion 174 of the corrugated conformal film 111 are outside the plane L3-L4 of FIG. 12. The source 138, the body 108, the gate dielectric layer 128, the gate 130, the field plate dielectric layer 126, the field plate 132, the drift region 112, the intermediate drain region 136, the drain contact region 140, the metal silicide 142, the source contact 146, and the drain contact 148 extend along the first portion 118 of the corrugated surface 116, and along first portion 171 of the corrugated conformal film 111.

In the example of FIG. 4, body 108 is formed by conformal doping and using the tri-level mask M1. Forming body of Step 704 of FIG. 13 can be performed using other suitable method. FIG. 14 illustrates another example of forming body by conformal doping and using gate and field plate as a mask. Referring to FIG. 14, the gate dielectric layer 128 is removed where exposed by the gate 130, and gate 130 exposes portions 111B for conformal doping. Further, conformal film formation technique, such as conformal doping using CVD, is used to conformally dope first conductivity type dopants into exposed regions of portions 111B of the conformal film 111 and a portion of the substrate 102 as defined by gate 130, and some (or a portion) of first conductivity type dopants can further move to regions R1 of portions 111B by lateral diffusion along +X direction, where regions R1 of portions 111B are covered by gate 130 and gate dielectric layer 128 (e.g., underneath gate 130), and include channel regions.

In some examples, gate 130 and field plate 132, and gate dielectric layer 128 and field plate dielectric layer 126 can be longer than the lengths shown in FIG. 14, e.g., extending further to cover the drift region 112, when forming body 108, so as to protect the drift region 112.

By the above-described conformal doping using gate and field plate as a mask and diffusion of FIG. 14, body 108 can extend to regions (such as regions R1 of portions 111B) covered by gate 130 and gate dielectric layer 128 to provide channel regions for the respective semiconductor device. In some examples, with body 108 extending, by diffusion, to regions covered by gate 130 and gate dielectric layer 128 to provide channel regions, respective semiconductor device can include or be a folded laterally-diffused metal-oxide semiconductor (LDMOS) device or double-diffused metal-oxide-silicon field effect transistor (MOSFET) device.

The respective semiconductor device or certain components of the respective semiconductor device can be the same as or similar to device 100, and methods of forming other components of the respective semiconductor device can be the same as or similar to the methods of forming components of device 100. References can be made to the above description, e.g., about device 100 and methods thereof.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Moreover, the methods described may include more, fewer, or other steps. Additionally, steps may be performed in any suitable order.

While the use of particular transistors is described herein, other transistors (or equivalent devices) may be used instead. For example, a p-channel field effect transistor ("PFET") may replace an n-channel field effect transistor ("NFET").

In this description, unless otherwise stated, "about," "approximately" or "substantially" preceding a parameter means being within +1-10 percent of that parameter.

Modifications are possible in the described embodiments, and other embodiments are possible, within the scope of the claims.

What is claimed is:

1. A device, comprising:
   a semiconductor substrate including a first corrugated surface;
   a film over and conformal to the first corrugated surface and forming a second corrugated surface, the first corrugated surface being between the second corrugated surface and the semiconductor substrate, the film having a first region and a second region, the first region configurable as at least a part of a drift region, and the second region configurable as at least a part of a body;
   a gate dielectric layer over the film;
   a gate over the gate dielectric layer; and
   a source coupled to the body; and
   a drain contact region coupled to the drift region.

2. The device of claim 1, wherein:
   the drift region is in contact with the body at a contact portion therebetween; and
   the contact portion has a corrugated shape.

3. The device of claim 1, wherein:
   the drain contact region extends along the first region.

4. The device of claim 1, wherein the first corrugated surface includes:
   a first portion having a first edge and a second edge,
   a second portion having a first edge and a second edge,
   a third portion extending from the second edge of the first portion to the first edge of the second portion, and
   a fourth portion extending from the second edge of the second portion.

5. The device of claim 4, wherein:
   the body extends along at least one of the first portion, the second portion, the third portion, or the fourth portion of the first corrugated surface;
   the gate dielectric layer extends along at least one of the first portion, the second portion, the third portion, or the fourth portion of the first corrugated surface;
   the gate extends along at least one of the first portion, the second portion, the third portion, or the fourth portion of the first corrugated surface; and
   the drift region extends along at least one of the first portion, the second portion, the third portion, orand the fourth portion of the first corrugated surface.

6. The device of claim 1, wherein the film is epitaxially formed on the first corrugated surface of the semiconductor substrate.

7. The device of claim 1, further comprising:
   a field plate dielectric layer over the drift region; and
   a field plate over the field plate dielectric layer.

8. The device of claim 1, further comprising:
   a charge balance region in the semiconductor substrate coupled to the drift region, the charge balance region having a different conductivity type from the drift region.

9. The device of claim 8, wherein a doping concentration change between a net doping concentration of the drift region and a net doping concentration of the charge balance region changes by $1 \times 10^{16}$ cm$^{-3}$ to $1 \times 10^{18}$ cm$^{-3}$ over a distance of 100 nm.

10. The device of claim 1, wherein the drift region includes at least one of silicon, germanium, or silicon-germanium.

11. A device, comprising:
    a semiconductor substrate and including a trench, a fin, and, a first corrugated surface over the trench and the fin; and
    a film over and conformal to the first corrugated surface and forming a second corrugated surface, the first corrugated surface being between the second corrugated surface and the semiconductor substrate, the film having a first region and a second region, the first region configurable as at least a part of a drift region, and the second region configurable as at least part of a body.

12. The device of claim 11, further comprising:
    a charge balance region in the semiconductor substrate contacting the first region, the charge balance region having a different conductivity type from the drift region.

13. The device of claim 12, wherein a doping concentration change between a net doping concentration of the first region and a net doping concentration of the charge balance region is changes by $1 \times 10^{16}$ cm$^{-3}$ to $1 \times 10^{18}$ cm$^{-3}$ over a distance of 100 nm.

14. The device of claim 11, wherein the first region includes at least one of silicon, germanium, or silicon-germanium.

15. A semiconductor device, comprising:
    a semiconductor substrate having a first corrugated surface;
    a film over and conformal with the first corrugated surface of the semiconductor substrate, the film forming a second corrugated surface, the first corrugated surface being between the first corrugated surface and the semiconductor substrate, the film having a first region and a second region, the first region configurable as at least a part of a drift region, and the second region configurable as at least a part of a body;

a gate dielectric layer over the second region of the film;

a gate over the gate dielectric layer;

a charge balance region in the semiconductor substrate coupled to the drift region, the charge balance region having a different conductivity type from the drift region;

a source coupled to the body; and a drain contact region coupled to the drift region.

16. The semiconductor device of claim 15, wherein the film is an epitaxial layer.

17. The semiconductor device of claim 15, wherein the drift region comprises germanium or silicon-germanium.

* * * * *